United States Patent
Ono

[11] Patent Number: 6,127,711
[45] Date of Patent: Oct. 3, 2000

[54] SEMICONDUCTOR DEVICE HAVING PLURAL AIR GAPS FOR DECREASING PARASITIC CAPACITANCE

[75] Inventor: Atsuki Ono, Tokyo, Japan

[73] Assignee: NEC Corporation, Tokyo, Japan

[21] Appl. No.: 09/102,363

[22] Filed: Jun. 23, 1998

[30] Foreign Application Priority Data

Jun. 23, 1997 [JP] Japan ..................................... 9-165800

[51] Int. Cl.⁷ .................................................. H01L 29/78
[52] U.S. Cl. .......................... 257/410; 257/900; 438/422; 438/595
[58] Field of Search ................................... 257/410, 411, 257/900; 438/421, 422, 591, 595

[56] References Cited

U.S. PATENT DOCUMENTS

| | | | |
|---|---|---|---|
| 5,736,446 | 4/1998 | Wu | 438/305 |
| 5,770,507 | 6/1998 | Chen et al. | 438/305 |
| 5,869,374 | 2/1999 | Wu | 438/291 |
| 5,869,379 | 2/1999 | Gardner et al. | 438/305 |
| 5,874,765 | 2/1999 | Lee et al. | 257/522 |
| 5,895,246 | 4/1999 | Lee | 438/305 |
| 5,914,519 | 6/1999 | Chou et al. | 257/410 |
| 5,972,763 | 10/1999 | Chou et al. | 438/305 |
| 6,015,746 | 1/2000 | Yeh et al. | 438/421 |

FOREIGN PATENT DOCUMENTS

| | | |
|---|---|---|
| 4-124834 | 4/1992 | Japan . |
| 7-193233 | 7/1995 | Japan . |
| 9-246544 | 9/1997 | Japan . |

OTHER PUBLICATIONS

Togo, et al. "A Gate–side Air–gap Structure (GAS) to Reduce the Parasitic Capacitance in MOSFETs", 1996 Symposium on VSLI Technology Digest of Technical Papers, pp. 38–39, 1996.

*Primary Examiner*—David Hardy
*Attorney, Agent, or Firm*—Foley & Lardner

[57] ABSTRACT

A method of manufacturing a semiconductor device includes the step of forming a gate electrode on a semiconductor substrate via a gate insulating film and the step of forming a first insulating film on side surfaces of the gate electrode and an upper surface of the semiconductor substrate. Also the method includes the step of forming a second insulating film on the first insulating film and the step of etching back the first and second insulating films to form side walls of the gate electrode each of which includes layers of the first and second insulating films. The method includes the step of etching the first insulating films of the side walls to remain a part of the first insulating film layers.

6 Claims, 3 Drawing Sheets

SEMICONDUCTOR DEVICE HAVING PLURAL AIR GAPS FOR DECREASING PARASITIC CAPACITANCE

BACKGROUND OF THE INVENTION

1. Field of the Invention

The present invention relates to a method of manufacturing a semiconductor device. More particularly, the present invention relates to a method of manufacturing a semiconductor device with lowered-parasitic capacitance.

2. Description of the Related Art

Semiconductor devices are structured to be finer with correspondence to the largeness of the scale thereof. The finer the structure is, the stronger the influence of the performance of a semiconductor because of the parasitic resistance and the parasitic capacitance. In order to perform a larger scale of an integrated circuit or improve the speed of the calculation, it is necessary for the larger scale of integrated circuit itself to operate with higher speed.

It is a basic principal that the speed of operation of a semiconductor device depends on the product of the resistance of a semiconductor element as a switching element by the capacitance of the gate thereof, called the CR time constant. The smaller the CR time constant, the higher the speed of operation. The higher performance in speed is improved by the finer structure of a semiconductor device with the smaller CR time constant.

The problem remains in that the performance of a circuit is not more desirably improved in spite of the finer structure because both the parasitic resistance and the parasitic capacitance actually remain in the circuit. In regarding to the parasitic w capacitance, the fringe capacitance formed w between a gate electrode and a source/drain region as a diffusion layer region, is an important issue in the improvement of the performance of a circuit.

One example of the conventional MOSFET-structure is disclosed in Japanese Laid-Open Patent application (JP-A-Heisei 7-193233). In this MOSFET-structure, a air gap is formed for lowering the parasitic capacitance between a gate electrode and a source/drain region. In FIG. 1, in the side portion of an gate electrode 20, a $Si_3N_4$ layer (not shown) is provided. Next, a source/drain 30 is formed by injecting ions. After that, a mounting potion is mounted on the source/drain 30 by selective epitaxial method. After the $Si_3N_4$ layer is removed, then a CVD oxide layer 70 is deposited such that the removed $Si_3N_4$ layer is replaced by a vacuum.

In this structure, the oxide layer 70, with the relative permitivity 3.9, located on the side portion of the gate electrode 20, is removed. As a result, the fringe capacitance between the gate electrode 20 and the source/drain 30 is lowered in comparison with another one wherein the oxide layer 70 is filled therein. Thereby, the parasitic capacitance is lowered.

Also, Togo showed another structure of MOSFET in his paper (1996, Symposium On VLSI Technology, Digest of Technical Papers). In this structure, without using a selective Si-growth method, an air gap as a space is formed around a Si-polycrystaline portion by etching the side wall portion of MOSFET. As shown in FIG. 2A, a gate electrode 5 is formed on a silicon plate 1 through a gate oxide layer 4. After that, a first side wall as a silicon nitride layer 17 is formed on the side surface of the gate electrode 5. In FIG. 2B, a second side wall as a silicon oxide layer 18 is formed on the side surface of the first side wall. Further, in FIG. 2C, the first side wall is removed by etching to form an air gap 11A around the gate electrode 5.

However, in the method shown in FIG. 1, it is necessary to use a selective Si-growth method for a source/drain region. Therefore, the method is complicated. Further, according to current selective Si-growth technology, it is inevitable to generate a great deal of farsets at the end portions of the growth region, if the selectivity is improved with respect to the surfaces of the oxide film and the silicon film layer. Thereby, it has a demerit that it is difficult to form the air gaps. It is desirable that such air gaps are formed so that the fringe capacitance between the gate electrode and the source/drain is decreased without any complicated procedures.

On the other hand, in the method shown in FIG. 2A–2C, it is necessary to etch the narrow gaps formed around the fringe of the Si-polycrystaline gate electrode, that is, the gaps corresponding to the region of high aspect ratio. Therefore, it is very difficult to form the air gaps 11A.

As mentioned above, it is necessary to lower the parasitic capacitance of a circuit in order to improve the performance thereof. Such an improvement may not cause the complication of process for manufacturing circuits and the narrower process window therefor.

SUMMARY OF THE INVENTION

The present invention is made to solve the problems in the conventional technique as mentioned above. An object of the present invention is to provide a method for manufacturing a semiconductor device which is able to effectively and simply lower the parasitic capacitance with well-controlling.

In order to achieve an aspect of the present invention, a method of manufacturing a i semiconductor device includes the steps of forming a gate electrode on a semiconductor substrate via a gate insulating film, forming a first insulating film on side surfaces of said gate electrode and an upper surface of said semiconductor substrate, forming a second insulating film on said first insulating film, etching back said first and second insulating films to form side walls of said gate electrode each of which comprises layers of said first and second insulating films; and etching said first insulating films of said side walls to remain a part of said first insulating film layers.

In this case, the first insulating film is formed of silicon nitride.

Also in this case, the method further includes the step of performing thermal treatment before the formation of the second insulating film after the formation of the first insulating film.

In this case, the thermal treatment is performed in an oxidizing ambient gas.

Also in this case, the oxidizing ambient gas is a $O_2$ gas or an $N_2O$ gas.

Further in this case, the second insulating film is formed of silicon oxide. Also, the method further includes the step of forming a third insulating film to cover the gate electrode with the side walls after the etching step.

In order to achieve another aspect of the present invention, the method of manufacturing a semiconductor device includes the steps of forming a gate electrode on a semiconductor substrate via a gate insulating film, forming a first insulating film on side surfaces of the gate electrode and an upper surface of the semiconductor substrate, forming a second insulating film on the first insulating film and etching back the first and second insulating films such that each of side walls is formed to have air gaps in partial between a layer of the second insulating film and the side surface of the gate electrode.

In this case, the first insulating film is formed of silicon nitride.

Also the method further includes the step of performing thermal treatment before the formation of the second insulating film after the formation of the first insulating film.

Further the thermal treatment is performed in an oxidizing ambient gas.

Also in this case, the oxidizing ambient gas is a $O_2$ gas or an $N_2O$ gas.

In this case, the second insulating film is formed of silicon oxide.

Also the method further includes the step of forming a third insulating film to cover the gate electrode with the side walls while remaining the air gaps, after the etching step.

In order to achieve still another aspect of the present invention, the semiconductor device includes a gate electrode formed on a semiconductor substrate via a gate insulating film and a side walls formed on side surfaces of the gate electrode to have air gaps in partial between an upper surface of the semiconductor substrate and the side wall.

In this case, the semiconductor device further includes a second insulating film to cover the gate electrode with the side walls while remaining the air gaps.

In order to yet another aspect of the present invention, the semiconductor device includes a gate electrode formed on a semiconductor substrate via a gate insulating film, first insulating film layer provided on side surfaces of the gate electrode, second insulating film layer provided on the first insulating film layer, and wherein first air gaps are formed between an upper surface of the w semiconductor substrate and the first insulating film layer, and second air gaps are formed between the upper surface and the second insulating film layer, and the first air gaps are larger than the second air gaps.

In this case, the semiconductor device further includes a third insulating film to cover the gate electrode while remaining the first and second air gaps.

In order to achieve a aspect of the present invention, the semiconductor device includes a semiconductor substrate, a gate electrode formed on the semiconductor substrate via a gate insulating film, first insulating film layers provided on side surfaces of the gate electrode, second insulating film layers provided on the first insulating film layers, a first air gaps formed between an upper surface of the semiconductor substrate and the first insulating film layers and a second air gap formed between each of side surfaces of the gate electrode and the second insulating layer.

Also the semiconductor device further includes a third insulating film layer to cover the gate electrode while remaining the first and second air gaps.

BRIEF DESCRIPTION OF THE DRAWINGS

A more complete understanding of the teachings of the present invention may be acquired by referring to the accompanying figures, in which like reference numbers indicate like features and wherein.

DESCRIPTION OF THE PREFERRED EMBODIMENTS

Referring now to drawings, a method of manufacturing a semiconductor device according to an embodiment of the present invention will be described.

FIG. 3A–3D shows a first embodiment thereof, wherein it is applied to a n type MOSFET, it being also able to be applied to a p type MOSFET.

Figure 1:
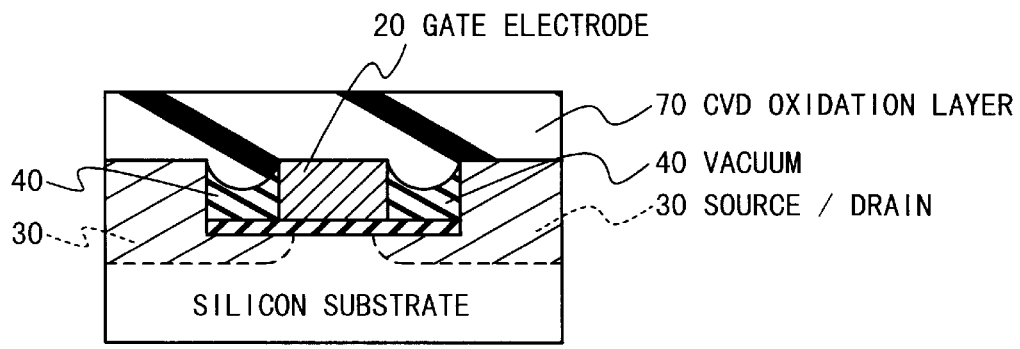
FIG. 1 is a cross section of a first conventional example of a semiconductor device.
Figure 2A:
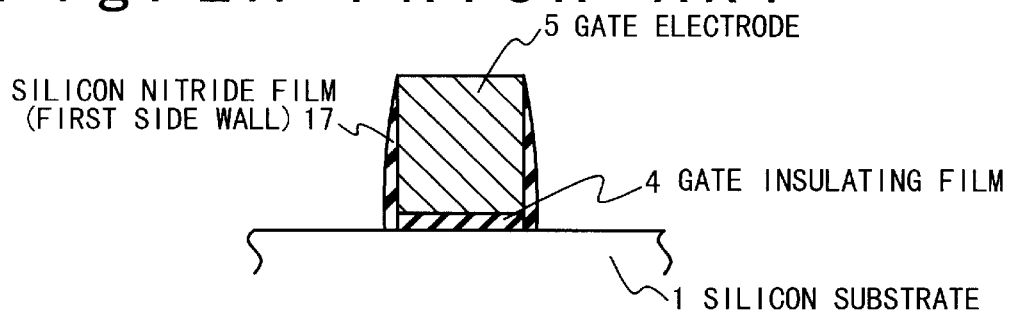
FIG. 2A is a cross section of a second conventional example of a first step of a method of manufacturing a semiconductor device.
Figure 2B:
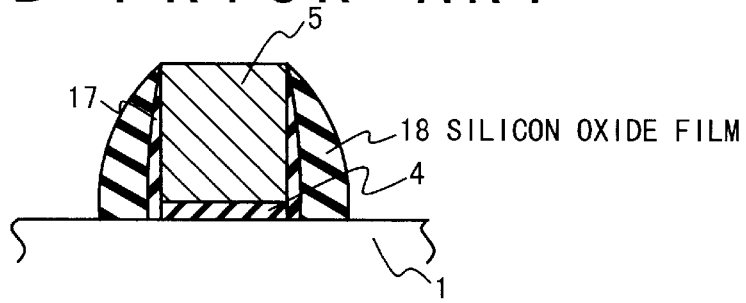
FIG. 2B is a cross section of a second conventional example of a second step of a method of manufacturing a semiconductor device.
Figure 2C:
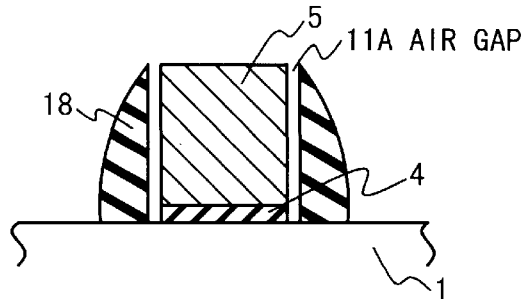
FIG. 2C is a cross section of a second conventional example of a third step of a method of manufacturing a semiconductor device.
Figure 3A:
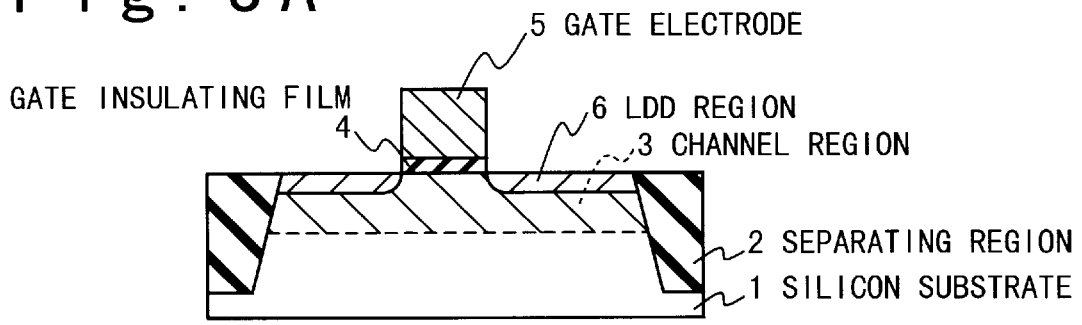
FIG. 3A is a cross section of a first step of a method of manufacturing a semiconductor device according to a first embodiment of the present invention.

As shown in FIG. 3A, an element separating region 2 is formed on a p type silicon plate 1. A p type channel region 3 is formed within the element separating region 2. The well or the threshold is designed as it is approximately 0.5 V. Further, a gate oxide layer 4 of 5 nm in thickness is formed on the p type channel region 3 by means of thermal oxidation method.

Still further, a polycrystalline silicon layer is deposited to be formed with a thickness of 200 nm by a CVD method (chemical vapor deposition method). Such deposited layer is patterned, and as a result, a gate electrode 5 is formed. After forming the gate electrode 5, a LDD region 6 is formed on the channel region 3 within the element separating region 2.

The element separating region 2 is formed by the set of steps: etching the portion of the plate 1 of 300–400 nm in thickness, filling a oxide layer into the etched portion, and polishing the surface of the oxide layer by a chemical mechanical polishing method to be flat.

The Si-polycrystaline layer to be the gate electrode 5 is etched by a reactive ion-etching method wherein the selection ratio is sufficiently high with respect to the gate oxide layer 4. The LDD region 6 is formed by an ion implanted method in the case of a n type MOSFET, wherein the injection energy to inject arsenic (As) as impurities is 15 keV, and the dose equivalent is $1\times10^{14}$ cm$^{-2}$.

Figure 3B:
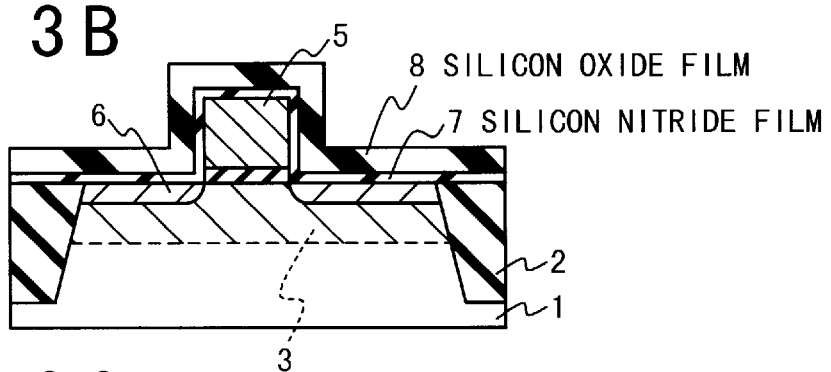
FIG. 3B is a cross section of a second step of a method of manufacturing a semiconductor device according to a first embodiment of the present invention.

As shown in FIG. 3B, a silicon nitride layer 7 is deposited to be formed on the LDD region 6 and the gate electrode 5 with the thickness being 10–30 nm by a CVD method. After the accumulating, the silicon nitride layer 7 is rapidly oxidized at a high temperature in the atmosphere of oxygen or N$_2$O. Such a process has a normal pressure and 1000 degree C of temperature in the atmosphere of oxygen for about 10 seconds. Such a process, which may be deleted without any consideration of adhesion, facilitates the adhesion of the silicon nitride layer 7 to a oxide layer formed on the following process by a CVD method. Further, a silicon oxide layer 8 is deposited to be formed on the silicon nitride layer 7 with thickness of 60–80 nm by a CVD method. During the accumulation of the silicon oxide layer 8, the temperature is kept at 700–800 degree C for effective coverage against the gate electrode 5.

Figure 3C:
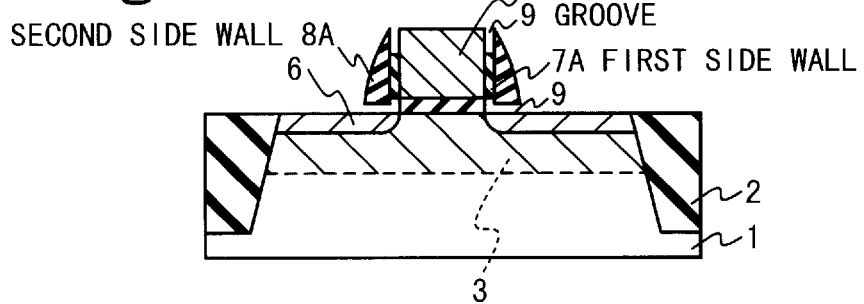
FIG. 3C is a cross section of a third step of a method of manufacturing a semiconductor device according to a first embodiment of the present invention.

Further, as shown in FIG. 3C, the silicon oxide layer 8 and the silicon nitride layer 7 are etched back by an isotropic etching method. As a result, a first side wall 7A and a second side wall 8A is be formed. The etching-back is performed to expose the surface of the polycrystalline silicon layer as the gate electrode 5.

Next, the resulting structure is further etched by using phosphoric acid at about 65 degree C in the temperature of the liquid. By the etching, the surface portion of the silicon nitride layer 7 exposed on the first side wall 7A is etched by about 70 nm. As a result, only the silicon nitride layer 7 positioning at the ends of the gate oxide layer 4 and the silicon nitride layer 7 positioning at the upper portion of the side wall of the gate electrode 5 are etched to be removed. Thereby a groove 9 is formed.

Figure 3D:
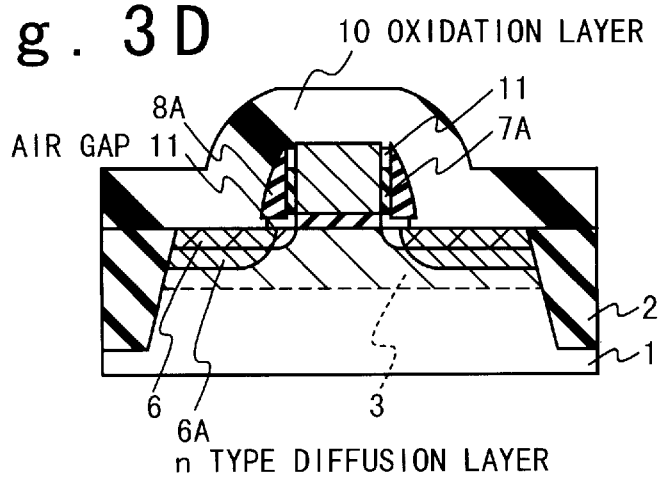
FIG. 3D is a cross section of a fourth step of a method of manufacturing a semiconductor device according to a first embodiment of the present invention.

As shown in FIG. 3D, a high density of n type diffusion layer 6A as a source-drain region is formed by a ion implanted method. The ion implantation is performed with the injection energy to inject arsenic as impurities being controlled to be 15 keV, and with the dose equivalent being controlled to be $5 \times 100^{15}$ cm$^{-2}$. The impurities are activated by a RTA on a rapidly treating processing high-temperature thermal process in the nitrogen atmosphere at 1000 degree C in the temperature for 10 seconds. As a result, the n type diffusion layer is be formed.

Next, a oxide layer 10 is deposited to be formed by the CVD method with the thickness of 60–100 nm at a comparablely low temperature, for instance, about 400 degree C of the plate 1. On the condition of the mentioned-above low temperature during the growth of the accumulation, the coverage is bad. Because of the bad coverage, the oxide film is not deposited at the end portions of the gate oxide layer 4 and at the upper portion of the side wall of the gate electrode 5. As a result, air gap(s) 11 are formed.

Using conventional processes after such processing, an well-flat oxide layer, for instance BPSG containing phosphorus and boron is further deposited on the oxide layer 10 by CVD method. And, using conventional processes, contact holes are formed in the oxide layer 10 to form electrodes.

In the embodiment, after the n type diffusion layer is formed, the bad-coverage oxide layer is formed. Before the n type diffusion layer is formed, a siliside layer may be formed on the gate electrode 5 and the n type diffusion layer.

FIG. 4A–4D shows a second embodiment according to the present invention.

Figure 4A:
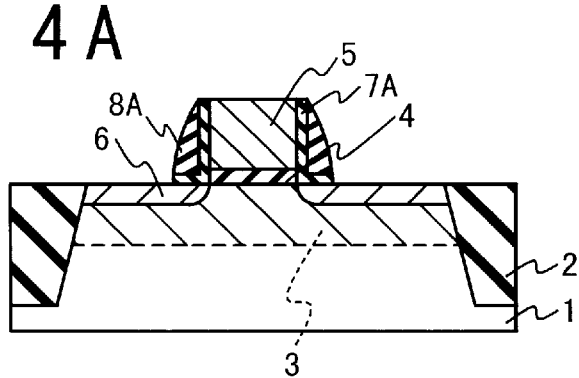
FIG. 4A is a cross section of a first step of a method of manufacturing a semiconductor device according to a second embodiment of the present invention.
Figure 4B:
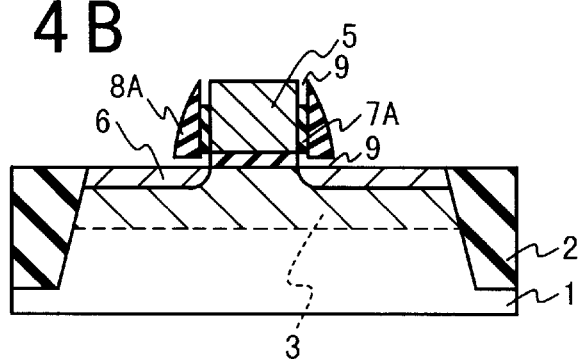
FIG. 4B is a cross section of a second step of a method of manufacturing a semiconductor device according to a second embodiment of the present invention.

As shown in FIG. 4A, by operations in the second embodiment being same as the ones of the first embodiment, an element separating region 2 is formed on a p type silicon plate 1. A p type channel region 3 is formed within the separating region 2. The well or the threshold is designed as it is approximately 0.5 V. Further, a gate oxide layer 4 of 5 nm in thickness is formed on the p type channel region 3 by means of thermal oxidation method.

Still further, a polycrystalline silicon layer to be a gate electrode is deposited to be formed with the thickness of 200 nm by a CVD method. And the gate electrode 5 and a LDD region 6 are formed on the channel region 3 within the separating region 2. The element separating region 2 is formed by the set of steps: etching the portion of the plate 1 of 300–400 nm in thickness, filling a oxide layer into the etched portion, and polishing the surface of the oxide layer by a chemical mechanical polishing method to be flat.

The Si-polycrystaline layer as the gate electrode 5 is etched by a reactive ion-etching method wherein the selection ratio is sufficiently high with respect to the gate oxide layer 4. The LDD region 6 is formed by an ion implanted method in the case of a n type MOSFET, wherein the injection energy to inject arsenic (As) as impurities is 15 keV, and the dose equivalent $1 \times 10^{14}$ cm$^{-2}$.

A silicon nitride layer 7 is deposited to be formed on the LDD region 6 with the thickness being 10–30 nm by a CVD method. After the accumulating, the silicon nitride layer 7 is rapidly oxidized at a high temperature in the atmosphere of oxygen or N$_2$O. Such a process has a normal pressure and 1000 degree C of temperature in the atmosphere of oxygen for about 10 seconds. Further, an silicon oxide layer 8 is deposited to be formed on silicon nitride layer 7 with thickness of 60–80 nm. The temperature is kept at 700–800 degree C for effective coverage. The layers are etched-back by an isotropic etching method. As a result, a first side wall 7A and a second side wall 8A are formed. The etching-back is performed to expose the surface of the polycrystalline silicon layer as the gate electrode 5.

Next, the structure obtained by the etching-back is further etched by using phosphoric acid at about 65 degree C in the temperature of the liquid. By the etching, the surface portion of the silicon nitride layer 7 exposed on the first side wall 7A is etched by 10–30 nm. As a result, only the silicon nitride layer 7 positioning at the ends of the gate oxide layer 4 and the silicon nitride layer 7 positioning at the upper portion of the side wall of the gate electrode 5 are etched to be removed. Thereby a groove 9 is formed.

Figure 4C:
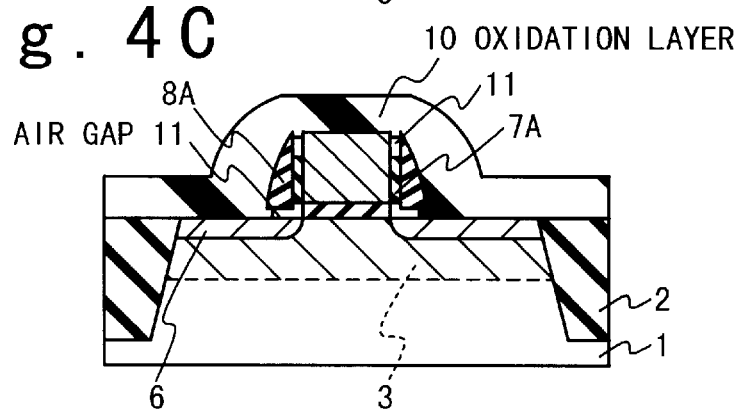
FIG. 4C is a cross section of a third step of a method of manufacturing a semiconductor device according to a second embodiment of the present invention.

As shown in FIG. 4C, a oxide layer 10 is deposited to be formed by a CVD method with the thickness of 10–30 nm at a comparablely low temperature, for instance, about 400 degree C such that the coverage of the oxide layer 10 is not well against the gate electrode 5. As a result, the region where the nitride layer 7 is partially etched is not refilled by the oxide layer 10. Therefore, air gaps 11 are formed.

Figure 4D:
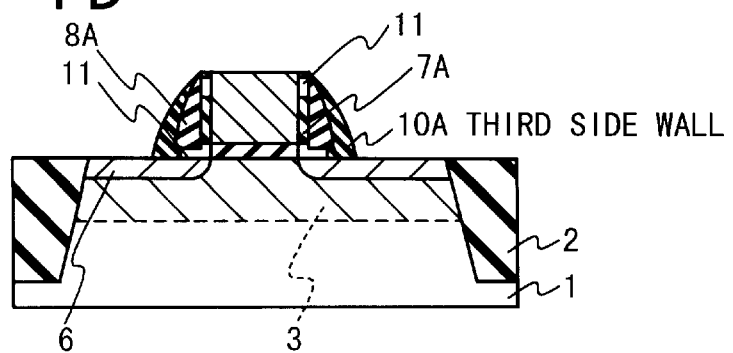
FIG. 4D is a cross section of a fourth step of a method of manufacturing a semiconductor device according to a second embodiment of the present invention.

As shown in FIG. 4D, the oxide layer 10 is etched-back till the polycristlline silicon layer as gate electrode 5 is exposed. As a result, a third side wall 10A including the oxide layer 10 is formed.

After such processing, ion-injecting for forming source-drain region, activating thereof, wiring by accumulating an well-flat oxide layer, for instance BPSG containing phosphorus and boron, by a CVD method, forming contact holes, and forming electrodes are same as conventional ones.

Such a second embodiment has a disadvantage that there is an additional process increased for etching-back the oxide layer 10a in comparison with the first embodiment. On the contrary to the disadvantage, there is an advantage in the second embodiment. The advantage is that because the air gap region is covered by the side wall of the oxide layer 10 on the process of forming siliside usually taken after forming the diffusion layer of the source/drain, the reliability of transistors are higher than the one of the first embodiment.

As described above, the present invention can form air gaps to effectively lower the parasitic capacitance of a semiconductor device with well-controlling without any selective Si-growth technology and without etching the region having its greater aspect ratio. Thereby, the present invention can provide a process for a semiconductor device, in which the parasitic capacitance is decreased.

What is claimed is:

1. A semiconductor device comprising:

a gate electrode formed on a semiconductor substrate via a gate insulating film; and side walls having a first and second insulating layer and formed on side surfaces of said gate electrode so as to form air gaps between an upper surface of said semiconductor substrate and said first and second insulating layers of said side wall.

2. A semiconductor device comprising:

a gate electrode formed on a semiconductor substrate via a gate insulating film;

a first insulating film layer provided on side surfaces of said gate electrode;

a second insulating film layer provided on said first insulating film layer, and wherein an air gap having a first portion is formed between an upper surface of said semiconductor substrate and said first insulating film layer, and a second portion which is formed between said upper surface and said second insulating film layer.

3. A semiconductor device as decided in claim 2 wherein said first portion is larger than said second portion.

4. A semiconductor device according to claim 2, further comprising a third insulating film to cover said gate electrode.

5. A semiconductor device comprising:

a semiconductor substrate;

a gate electrode formed on said semiconductor substrate via a gate insulating film;

a first insulating film layer provided on side surfaces of said gate electrode; and a second insulating film layer provided on said first insulating film layer;

a first air gap formed between an upper surface of said semiconductor substrate and said first insulating film layer; and a second air gap formed between each of side surfaces of said gate electrode and said second insulating layer.

6. A semiconductor device according to claim 5, further comprising a third insulating film layer to cover said gate electrode.

* * * * *